United States Patent
Yang et al.

(10) Patent No.: US 11,088,321 B2
(45) Date of Patent: *Aug. 10, 2021

(54) HIGHLY SELECTIVE ION BEAM ETCH HARD MASK FOR SUB 60NM MRAM DEVICES

(71) Applicant: Taiwan Semiconductor Manufacturing Company, Ltd., Hsinchu (TW)

(72) Inventors: Yi Yang, Fremont, CA (US); Dongna Shen, San Jose, CA (US); Yu-Jen Wang, San Jose, CA (US)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 186 days.

This patent is subject to a terminal disclaimer.

(21) Appl. No.: 16/728,142

(22) Filed: Dec. 27, 2019

(65) Prior Publication Data

US 2020/0136031 A1    Apr. 30, 2020

Related U.S. Application Data

(60) Continuation of application No. 16/522,801, filed on Jul. 26, 2019, now Pat. No. 10,522,753, which is a (Continued)

(51) Int. Cl.
*H01L 43/12* (2006.01)
*H01L 43/08* (2006.01)
(Continued)

(52) U.S. Cl.
CPC ............ *H01L 43/12* (2013.01); *H01L 27/222* (2013.01); *H01L 43/02* (2013.01); *H01L 43/08* (2013.01)

(58) Field of Classification Search
CPC ......... H01L 43/12; H01L 43/08; H01L 43/02; H01L 27/222
See application file for complete search history.

(56) References Cited

U.S. PATENT DOCUMENTS 8,008,095 B2   8/2011  Assefa et al.
8,324,698 B2  12/2012  Zhong et al.
(Continued)

OTHER PUBLICATIONS

Yang, Yi et al., "Ion Beam Etching Fabricated Sub 30 NM Vias to Reduce Conductive Material Re-deposition for Sub 60 NM MRAM Devices", U.S. Appl. No. 15/947,512, filed Apr. 6, 2018, 17 pgs.

*Primary Examiner* — Victor A Mandala
(74) *Attorney, Agent, or Firm* — Haynes and Boone, LLP

(57) ABSTRACT

A via connection is provided through a dielectric layer to a bottom electrode. A MTJ stack is deposited on the dielectric layer and via connection. A top electrode is deposited on the MTJ stack. A selective hard mask and then a dielectric hard mask are deposited on the top electrode. The dielectric and selective hard masks are patterned and etched. The dielectric and selective hard masks and the top electrode are etched wherein the dielectric hard mask is removed. The top electrode is trimmed using IBE at an angle of 70 to 90 degrees. The selective hard mask, top electrode, and MTJ stack are etched to form a MTJ device wherein over etching into the dielectric layer surrounding the via connection is performed and re-deposition material is formed on sidewalls of the dielectric layer underlying the MTJ device and not on sidewalls of a barrier layer of the MTJ device.

20 Claims, 3 Drawing Sheets

Related U.S. Application Data division of application No. 15/951,873, filed on Apr. 12, 2018, now Pat. No. 10,388,862.

(51) Int. Cl.
  *H01L 43/02* (2006.01)
  *H01L 27/22* (2006.01)

(56) References Cited

U.S. PATENT DOCUMENTS

| | | | |
|---|---|---|---|
| 8,524,511 B1 * | 9/2013 | Zhong | H01L 43/08 438/3 |
| 8,883,520 B2 | 11/2014 | Satch et al. | |
| 10,522,753 B2 * | 12/2019 | Yang | H01L 43/02 |
| 2010/0102404 A1 * | 4/2010 | Li | H01L 43/12 257/421 |
| 2012/0326250 A1 * | 12/2012 | Gaidis | H01F 10/3254 257/421 |
| 2017/0098759 A1 * | 4/2017 | Oh | H01L 43/12 |
| 2018/0040668 A1 | 2/2018 | Park et al. | |
| 2019/0312197 A1 * | 10/2019 | Yang | G11C 11/161 |

* cited by examiner

HIGHLY SELECTIVE ION BEAM ETCH HARD MASK FOR SUB 60NM MRAM DEVICES

PRIORITY DATA

The present application is a continuation application of U.S. patent application Ser. No. 16/522,801, filed Jul. 26, 2019, which is a divisional application of U.S. patent application Ser. No. 15/951,873, filed Apr. 12, 2018, each of which is herein incorporated by reference in its entirety.

RELATED PATENT APPLICATION

This application is related to co-pending U.S. patent application Ser. No. 15/947,512 filed on Apr. 6, 2018, assigned to the same assignee as the present application and herein incorporated by reference in its entirety.

TECHNICAL FIELD

This application relates to the general field of magnetic tunneling junctions (MTJ) and, more particularly, to etching methods for forming sub 60 nm MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define the magnetic tunnel junctions (MTJ) in each MRAM device, precise patterning steps including photolithography and reactive ion etching (RIE), ion beam etching (IBE), or their combination are usually involved. During RIE, high energy ions remove materials vertically in those areas not masked by photoresist, separating one MTJ cell from another. However, the high energy ions can also react with the non-removed materials, oxygen, moisture, and other chemicals laterally, causing sidewall damage and lowering device performance.

To solve this issue, pure physical etching techniques such as ion beam etching (IBE) have been applied to etch the MTJ stack. However, due to the non-volatile nature, IBE etched conductive materials in the MTJ and the bottom electrode can be re-deposited into the tunnel barrier, resulting in shorted devices. Two approaches are usually applied to solve this issue. The first is to use high angle IBE to trim the MTJ sidewall to remove any re-deposition. The other solution is to greatly etch the MTJ so that the re-deposition can be confined below the tunnel barrier, without creating a shorting path. Both of these approaches require the MTJ hard mask to be very thick because this physical type of etch is not selective. However, this brings challenges for photolithography since a thick hard mask would require very thick photoresist, the patterns of which can easily collapse, especially when the size goes down to sub 60 nm. A new approach to enhance the IBE selectivity is needed to fully utilize the benefit of this technique.

Several patents teach methods of MTJ etching, including U.S. Pat. No. 8,324,698 (Zhong et al) and U.S. Pat. No. 8,008,095 (Assefa et al) and U.S. Patent Application 2018/0040668 (Park et al). These references are different from the present disclosure.

SUMMARY

It is an object of the present disclosure to provide an improved method of forming MTJ structures having without re-deposition of metal materials on the tunnel barrier layer.

Another object of the present disclosure is to provide a selective physical MTJ etching method.

Yet another object of the present disclosure is to provide a selective physical etching method for forming MTJ structures and a great over etch to avoid re-deposition of metal materials on the tunnel barrier layer.

A further object is to provide a selective physical etching method for forming MTJ structures and a great over etch as well as sidewall trimming can be applied to remove the conductive material re-deposition on the sidewall, reducing electrically shorted devices.

A still further object is to provide method of forming a dielectric-enclosed via connection between the bottom electrode and overlying MTJ structures wherein the via connection is narrower than the MTJ stack pattern and to provide a selective physical etching method for forming MTJ structures and a great over etch as well as sidewall trimming can be applied to remove the conductive material re-deposition on the sidewall, reducing electrically shorted devices.

In accordance with the objectives of the present disclosure, a method for etching a magnetic tunneling junction (MTJ) structure is achieved. A via connection is provided through a dielectric layer to a bottom electrode. A MTJ stack is deposited on the dielectric layer and the via connection. A top electrode is deposited on the MTJ stack. A selective hard mask is deposited on the top electrode. A dielectric hard mask is deposited on the selective hard mask. The dielectric and selective hard masks are patterned and etched. Thereafter, the dielectric and selective hard masks and the top electrode are etched wherein the dielectric hard mask is removed. The top electrode is trimmed using ion beam etching (IBE) at an angle of 70 to 90 degrees with respect to a normal line of a top surface of the top electrode. The selective hard mask, top electrode, and MTJ stack are etched wherein over etching is performed wherein a MTJ device is formed and wherein the dielectric layer surrounding the via connection is etched into and wherein re-deposition material is formed on sidewalls of the dielectric layer underlying the MTJ device and not on sidewalls of a barrier layer of the MTJ device.

Also in accordance with the objects of the present disclosure, a magnetic tunneling junction (MTJ) is achieved comprising a sub-60 nm MTJ device and a bottom electrode underlying the MTJ device and connected to the MTJ device by a metal via through a dielectric layer wherein the metal via has a width at least 5 nm narrower than the MTJ device.

BRIEF DESCRIPTION OF THE DRAWINGS

In the accompanying drawings forming a material part of this description, there is shown.

DETAILED DESCRIPTION

In the current art, the MTJ hard mask stack does not have any layer that is very resistive to the physical type of etch such as pure Ar RIE or IBE. This makes it challenging to pattern sub 60 nm devices. In the process of the present disclosure, we add materials such as carbon, which has a very low etch rate under ion beam etching, to the original hard mask stack. This thin hard mask layer ensures that it can be patterned by a thin photoresist, but still protect the whole MTJ during the later IBE process. That is, this process changes the nature of IBE from non-selective to selective etching. As a result, a great IBE over etch as well as sidewall trimming can be applied to remove the conductive material re-deposition on the sidewall, reducing electrically shorted devices.

Furthermore, by using a high angle ion beam etching (IBE) as disclosed in co-pending U.S. patent application Ser. No. 15/947,512, we can create sub 30 nm vias connecting the bottom electrode and sub 60 nm MTJ. These small vias are surrounded by dielectric materials and smaller than the MTJ, so that the conductive material re-deposition from the bottom electrode during MTJ etch can be avoided. A great over etch also becomes possible to confine the overall conductive material re-deposition from the MTJ stack below the MTJ junction, effectively reducing the shorted devices. The process of the present disclosure results in great pattern integrity and device yield.

Figure 1:
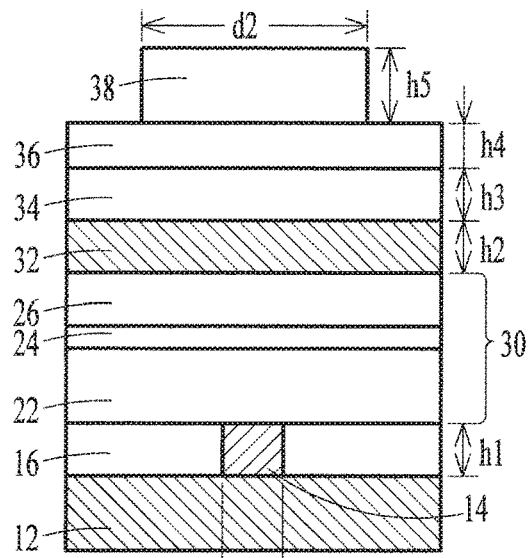
FIGS. 1 through 7 illustrate in cross-sectional representation steps in a preferred embodiment of the present disclosure.

The preferred embodiment of the present disclosure will be described in more detail with reference to FIGS. 1-7. FIG. 1 illustrates a bottom electrode layer 12 formed on a semiconductor substrate, not shown. Metal via 14 surrounded by dielectric material 16 is formed on top of the bottom electrode to a height h1 of >=45 nm. These small size vias, having a pattern size d1 of between about 20 to 30 nm, can be fabricated by 248 nm photolithography, followed by RIE or IBE trimming. They can also be fabricated by immersion 193 nm or EUV photolithography. The metal vias 14 may comprise Ta, TaN, Ti, TiN, W, Cu, Mg, Ru, Cr, Co, Fe, Ni or their alloys. The surrounding dielectric materials can be $SiO_2$, SiN, SiON, SiC, or SiCN.

MTJ film layers are deposited, typically including a seed layer, a pinned layer, a barrier layer, a free layer, and a cap layer, for example. These layers form the MTJ film stack 30. Pinned layer 22, barrier layer 24, and free layer 26 are identified in FIG. 1.

The top electrode layer 32, such as Ta, TaN, Ti, TiN, W, Cu, Mg, Ru, Cr, Co, Fe, Ni or their alloys with thickness h2 of 10 to 100 nm and preferably ≥50 nm, is deposited on the MTJ stack 30. Next, a hard mask layer 34 which is highly resistive to IBE is deposited onto the top electrode 32 to a thickness h3 of ≥50 nm. Some examples of this hard mask layer are CVD deposited or spin-on carbon, CVD deposited TaC, and PVD deposited Al or Be.

Table 1 below is from http://www.microfabnh.com/ion beam etch rates.php. As shown in Table 1, the IBE etch rate of carbon (C) is only approximately 60 Angstroms/minute, much lower than other commonly used metals in the MTJ hard mask and stack, the IBE etch rates of which are larger than 200 A/min. TaC, Al, and Be also have low etch rates, as can be seen in the table.

TABLE 1

| Material | Etch Rate (A/min) |
|---|---|
| Ag | 1050 |
| Al | 48 |
| Au | 630 |
| Az 1350 | 117 |
| Be | 76 |
| C | 64 |
| CdS | 1283 |
| Co | 262 |
| Cr | 309 |

TABLE 1-continued

| Material | Etch Rate (A/min) |
|---|---|
| Cu | 513 |
| Fe | 204 |
| Si | 216 |
| SiC | 204 |
| SiO2 | 192 |
| Hf | 385 |
| InSb | 887 |
| Ir | 344 |
| Ge | 537 |
| Mg | 131 |
| Mn | 507 |
| Mo2C | 163 |
| Nb | 274 |
| Ni | 309 |
| NiCr | 309 |
| Pb | 1517 |
| PbTe | 2199 |
| Pd | 642 |
| Pt | 362 |
| Rb | 2333 |
| Re | 303 |
| Rh | 420 |
| Riston 14 | 146 |
| Ru | 356 |
| Sb | 1889 |
| Ni80Fe20 | 292 |
| Ni | 309 |
| Zr | 332 |
| Ta | 245 |
| Ta2O5 | 350 |
| Tac | 87 |
| TaN | 233 |
| Ti | 192 |
| Ti or TiW | 195 |
| W | 198 |
| Y | 554 |
| Zr | 332 |

Next a thin dielectric layer 36 such as SiON, SiN, $SiO_2$, SiC or SiCN with thickness h4 (≥90 nm) is deposited onto the carbon layer 34. Finally, photoresist 38 is patterned by 248 nm photolithography, forming patterns with size d2 (approximately 70 to 80 nm) and height h5 of ≥200 nm.

Figure 2:
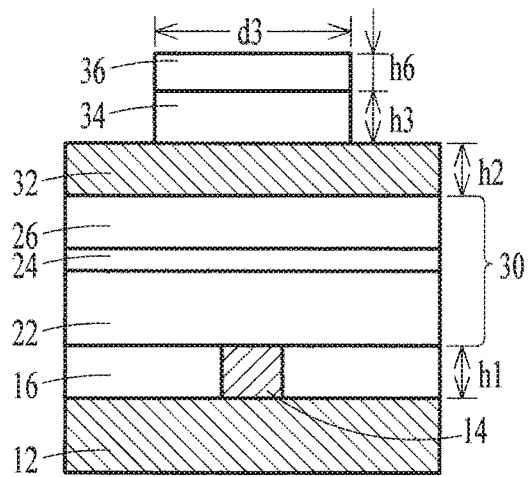

Now, referring to FIG. 2, the thin dielectric layer 36 is etched by RIE etching using fluorine carbon based plasma such as $CF_4$ or $CHF_3$ alone, or mixed with Ar and $N_2$. $O_2$ can be added to reduce the pillar size further. Alternatively, the thin dielectric layer 36 could be patterned by a physical type of etch such as IBE using Ar plasma.

Now, the hard mask 34 is etched. If carbon is used as the IBE resistive hard mask 34, $O_2$ alone or mixed with a halogen such as $Cl_2$ and HBr can be used to etch the hard mask 34, reducing the pattern size to d3, between about 60 and 70 nm. A halogen based plasma such as $Cl_2$ alone, or mixed with Ar and HBr can be used if TaC, Al, or Be are used as the hard mask 34. The remaining photoresist 38 on top of the thin dielectric layer 36 should be totally consumed during this etching step and the dielectric mask 36 height is reduced to h6, between about 80 and 90 nm.

Figure 3:
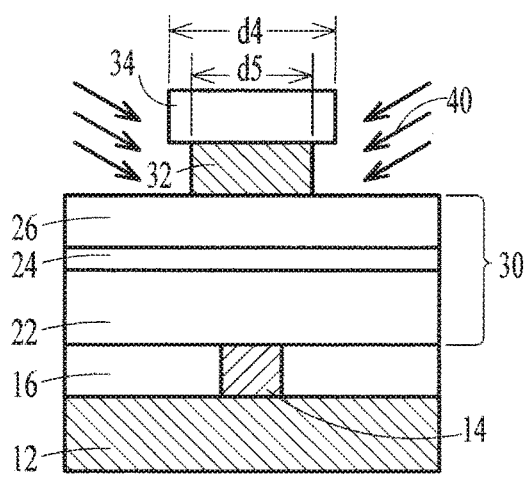

Next, referring to FIG. 3, the top electrode 32 is etched by RIE using fluorine carbon such as $CF_4$ or hydrogen such as $Cl_2$. Alternatively, the top electrode may be etched by IBE. This etching removes the dielectric mask layer 36 and reduces the pattern size to d4, between about 60 to 70 nm, about the same as d3 in FIG. 2.

With a high angle IBE trimming 40 such as 70 to 90° with respect to the surface's normal line, as shown in FIG. 3, the top electrode 32 pattern size decreases to d5, which can range from 50-60 nm, dependent on the IBE trimming conditions such as power (500-1000 W) and time (100-300 seconds). Due to the protection of the carbon layer 34 on top, the remaining top electrode height h2 stays the same after this step. The height of the carbon layer 34 is reduced to h7, between about 5 and 20 nm.

Figure 4:
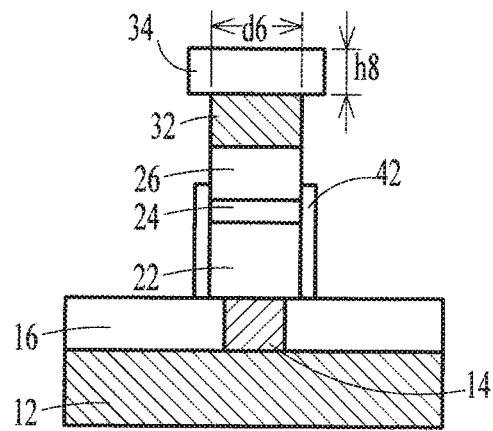

Referring now to FIG. 4, the MTJ stack 30 is etched by RIE, IBE, or their combination. If the patterning stops right after the pinned layer (PL) 22 is etched, the non-volatile conductive material re-deposition 42 from the MTJ itself would cover the tunnel barrier 24, resulting in electrically shorted devices. Pattern size d6 is now between about 50 and 60 nm. However in the process of the present disclosure, a great over etch can be applied without introducing more re-deposition from the bottom electrode, because the sub 30 nm vias underneath are overlaid by the MTJ and surrounded by dielectric material.

Figure 5:
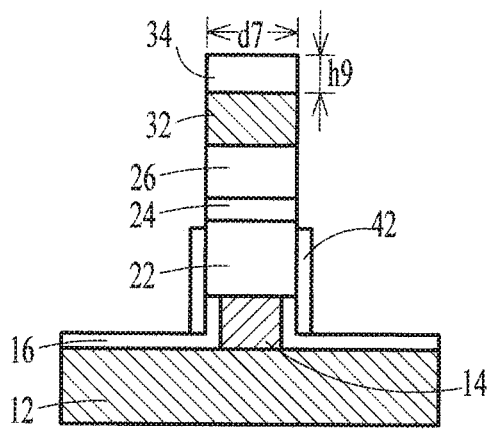

FIG. 5 illustrates the stack after the over etch. The material re-deposition on the tunnel barrier layer 24 has been removed by the over etch and further material re-deposition 42 is formed on sidewalls below the tunnel barrier layer 24. The final MTJ size d7 is about 50 to 60 nm.

Figure 6:
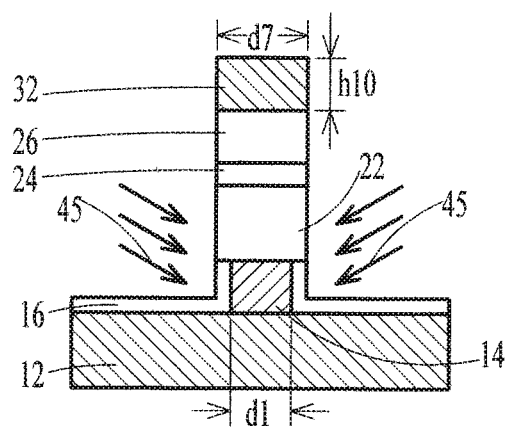

To further remove the electrical shorting, an additional ex-situ or in-situ IBE trimming 45 at large angle of 70 to 90 degrees can be applied to remove the MTJ sidewall re-deposition 42, as illustrated in FIG. 6. For in situ IBE trimming, wafers are transferred from the previous main etch step to the later trimming step continually without breaking vacuum, so that the vias are not exposed to the air to oxidize. For ex situ, the transfer step is done under atmosphere. In situ IBE trimming is preferred here since the MTJ stack is not exposed to water and oxygen damage in atmosphere. However, this brings a higher requirement for tools. When in-situ IBE trimming is not available, ex-situ trimming will work since the damaged layer should be at least partially removed by the trimming step. After IBE trimming, the final MTJ size d8 is about 40-50 nm.

During the whole etching process, the top electrode is protected by the carbon on top so that the whole device integrity is preserved. With or without the optional IBE trimming, the MTJ is at least 5 nm larger than the vias 14 underneath so that the photolithography overlay margin is covered.

Figure 7:
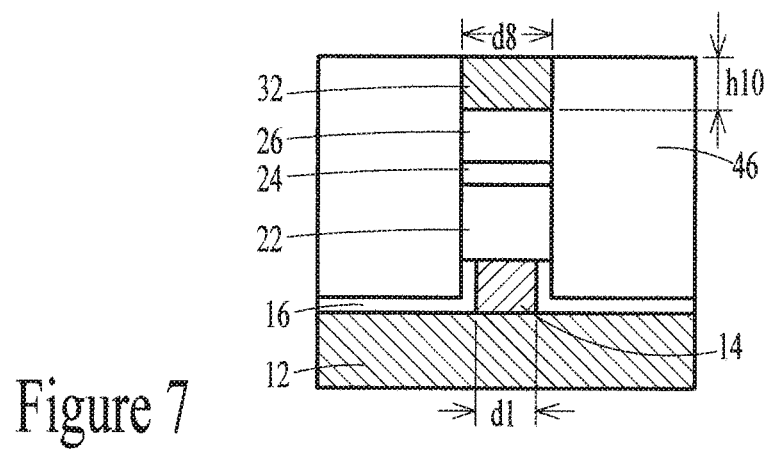

After patterning, the whole device can be encapsulated by dielectric or metal oxide such as $SiO_2$, SiN, SiON, SiC, SiCN, $Al_2O_3$ and MgO 46, as shown in FIG. 7. Either ex-situ or in-situ encapsulation may be used. A final CMP step is applied to flatten the surface and expose the top electrode, as well as removing any remaining carbon hard mask left from previous IBE steps. The top electrode 32 could alternatively be exposed by RIE to etch back the encapsulation material and remaining carbon mask. This RIE etch back process uses a carbon fluorine plasma such as $CF_4$, $CHF_3$, $CH_2F_2$, $C_4F_8$ mixed with $O_2$. Alternatively, a halogen plasma such as $Cl_2$ mixed with $O_2$ could be used. The added $O_2$ helps strip away the remaining carbon hard mask. The height of the top electrode is h10, remaining the same as the as-deposited height h2.

The process of the present disclosure changes the IBE process from non-selective to selective, so that it combines the benefit of chemical and physical etches; i.e., the MTJ can be physically etched without introducing chemical damage to the MTJ sidewall, but preserves great pattern integrity similar to what a chemical etch can provide. It therefore becomes possible to carry out a great IBE over etch as well as high angle sidewall trimming to greatly reduce electrically shorted devices. RIE can be very selective with the proper plasma species but it causes more chemical damage on the MTJ sidewall due to chemical reaction. IBE is a physical etch, bringing no chemical damage. The selective IBE etching of the present disclosure is preferable to RIE etching since the process of the present disclosure solves the problem of metal re-deposition.

The process of the present disclosure will be used for MRAM chips of size smaller than 60 nm as problems associated with chemically damaged sidewalls and re-deposition from the bottom electrode become very severe for these smaller sized MRAM chips.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:
1. A method comprising:
   forming a dielectric layer over a bottom electrode;
   forming a stack of magnetic tunnel junction (MTJ) layers over the dielectric layer, the stack of MTJ layers includes a barrier layer;
   forming a top electrode over the stack of MTJ layers;
   forming a first hard mask layer over the top electrode; and
   patterning the top electrode, the stack of MTJ layers and the dielectric layer by using the first hard mask layer as a mask, wherein the patterning re-deposits material on the dielectric layer without redepositing material on the barrier layer of the stack of MTJ layers.

2. The method of claim 1, wherein the stack of MTJ layers further includes a pinned layer, the barrier layer disposed over the pinned layer and a free layer disposed over the barrier layer, and
   wherein the patterning further re-deposits material on the pinned layer without redepositing material on the barrier layer and the free layer.

3. The method of claim 1, further comprising:
   removing the re-deposited material from the dielectric layer; and
   forming an encapsulating layer on the patterned dielectric layer, the bottom electrode, and the patterned stack of MTJ layers.

4. The method of claim 3, wherein the removing of the re-deposited material from the dielectric layer includes performing an ion beam etching process.

5. The method of claim 1, further comprising:
   forming a second hard mask layer over the first hard mask layer prior to the patterning, the second hard mask layer being formed of a different material than the first hard mask layer, and
   performing an etching process on the top electrode while using the first hard mask layer and the second hard mask layer as mask, wherein the second hard mask layer is completely removed during the performing of the etching process on the top electrode.

6. The method of claim 1, wherein the first hard mask layer includes carbon and the second hard mask layer includes a dielectric material.

7. The method of claim 1, wherein the first hard mask layer includes a material selected from the group consisting of C, TaC, Al and Be.

8. A method comprising:
   forming a dielectric layer over a bottom electrode;
   forming a stack of magnetic tunnel junction (MTJ) layers over the dielectric layer, the stack of MTJ layers includes a barrier layer;
   forming a top electrode over the stack of MTJ layers;

forming a carbon-containing hard mask layer over the top electrode;

forming a dielectric-containing hard mask layer over the carbon-containing hard mask layer; and patterning the top electrode using the dielectric-containing hard mask layer and the carbon-containing hard mask layer as a mask, wherein the dielectric-containing hard mask layer is removed during the patterning of the top electrode;

patterning the patterned top electrode, the stack of MTJ layers and the dielectric layer by using the carbon-containing hard mask layer as a mask, wherein the patterning re-deposits material on the dielectric layer without redepositing material on the barrier layer of the stack of MTJ layers; and removing the redeposited material from the dielectric layer.

9. The method of claim 8, wherein the patterning of the top electrode includes performing an ion beam etching process at an angle of about 70° to about 90° with respect to a normal line of a top surface of the top electrode.

10. The method of claim 8, wherein the patterning of the patterned top electrode, the stack of MTJ layers and the dielectric layer by using the carbon-containing hard mask layer as the mask includes performing an ion beam etching process.

11. The method of claim 8, wherein the patterning of the patterned top electrode, the stack of MTJ layers and the dielectric layer by using the carbon-containing hard mask layer as the mask includes performing a reactive ion etching process.

12. The method of claim 8, further comprising etching the dielectric-containing hard mask layer prior to the patterning of the top electrode, and wherein the etching of the dielectric-containing hard mask layer includes performing a reactive ion etching with a fluorine carbon-based plasma, the fluorine carbon-based plasma including a fluid selected from the group consisting of $CF_4$, $CHF_3$, Ar, $N_2$, $O_2$, and combinations thereof, and wherein the dielectric-containing hard mask layer includes a material selected from the group consisting of $SiO_2$, SiN, SiON, SiC and SiCN.

13. The method of claim 8, further comprising etching the carbon-containing hard mask layer prior to the patterning of the top electrode, and wherein the etching of the carbon-containing hard mask layer includes performing an ion beam etching with $O_2$ alone or mixed with a halogen including $Cl_2$ and HBr.

14. The method of claim 8, wherein the carbon-containing hard mask layer is wider than the patterned top electrode after the patterning of the top electrode using the dielectric-containing hard mask layer and the carbon-containing hard mask layer as the mask.

15. A method comprising:

forming a stack of magnetic tunnel junction (MTJ) layers, the stack of MTJ layers including a pinned layer, a barrier layer over the pinned layer and a free layer over the barrier layer;

forming a top electrode over the stack of MTJ layers;

forming a first hard mask layer over the top electrode;

forming a second hard mask layer over the first hard mask layer; and patterning the top electrode using the first hard mask layer and the second hard mask layer as a mask, wherein the second hard mask layer is removed during the patterning of the top electrode;

patterning the patterned top electrode, the stack of MTJ layers and the dielectric layer by using the carbon-containing hard mask layer as a mask to form an MTJ structure, wherein the patterning re-deposits material on the pinned layer without redepositing material on the barrier layer of the stack of MTJ layers; and removing the redeposited material from the pinned layer.

16. The method of claim 15, further comprising:

etching the second hard mask layer prior to the patterning of the top electrode, and etching the first hard mask layer prior to the patterning of the top electrode, and wherein the first hard mask layer includes a material selected from the group consisting of TaC, Al and Be, and wherein the etching of the first hard mask layer includes performing an ion beam etching with a halogen based plasma including $Cl_2$ alone, or mixed with Ar and HBr.

17. The method of claim 15, wherein patterning the top electrode using the first hard mask layer and the second hard mask layer as the mask includes performing a reactive ion etching process with $CF_4$ or $Cl_2$.

18. The method of claim 15, wherein patterning the top electrode using the first hard mask layer and the second hard mask layer as the mask includes performing an ion beam etching process at an angle of about 70° to about 90° with respect to a normal line of a top surface of the top electrode and applying RF power from about 500 W to about 1000 W for a duration of time from about 100 seconds to about 300 seconds.

19. The method of claim 15, further comprising encapsulating the MTJ structure with an encapsulation layer; and after encapsulating the MTJ structure, removing a portion of the encapsulating layer and the first hard mask layer to expose the patterned top electrode.

20. The method of claim 19, wherein the encapsulation layer incudes a material selected from the group consisting of $SiO_2$, SiN, SiON, SiC, SiCN, $Al_2O_3$ and MgO, and wherein the removing of the portion of the encapsulating layer and the first hard mask layer to expose the patterned top electrode includes performing a process selected from the group consisting of a chemical mechanical polishing, a first reactive ion etch process that utilizes a carbon fluorine plasma, and a second reactive ion etch process that utilizes a halogen plasma.

* * * * *